US011659660B2

(12) United States Patent
Frandsen et al.

(10) Patent No.: US 11,659,660 B2
(45) Date of Patent: May 23, 2023

(54) OXIDE LINER STRESS BUFFER (71) Applicant: Raytheon Company, Waltham, MA (US)

(72) Inventors: Christine Frandsen, Santa Barbara, CA (US); John J. Drab, Santa Barbara, CA (US); Andrew Clarke, Santa Barbara, CA (US)

(73) Assignee: RAYTHEON COMPANY, Waltham, MA (US)

( * ) Notice: Subject to any disclaimer, the term of this patent is extended or adjusted under 35 U.S.C. 154(b) by 699 days.

(21) Appl. No.: 16/671,468

(22) Filed: Nov. 1, 2019

(65) Prior Publication Data

US 2021/0136915 A1 May 6, 2021

(51) Int. Cl.
H05K 1/11 (2006.01)
H01L 21/48 (2006.01)
H01L 23/498 (2006.01)
H05K 1/03 (2006.01)
H05K 3/40 (2006.01)
H05K 3/46 (2006.01)

(52) U.S. Cl.
CPC ............ H05K 1/115 (2013.01); H01L 21/486 (2013.01); H01L 21/4857 (2013.01); H01L 23/49822 (2013.01); H05K 1/0306 (2013.01); H05K 3/4038 (2013.01); H05K 3/4623 (2013.01)

(58) Field of Classification Search
CPC .... H05K 1/115; H05K 3/4036; H05K 3/4623; H01L 121/4857; H01L 21/486; H01L 23/49822
See application file for complete search history.

(56) References Cited

U.S. PATENT DOCUMENTS

| 2005/0121768 | A1 | 6/2005 | Edelstein et al. |
| 2010/0230148 | A1 | 9/2010 | Kariya et al. |
| 2011/0076853 | A1 | 3/2011 | Mao |
| 2011/0147059 | A1 | 6/2011 | Ma et al. |
| 2015/0137387 | A1* | 5/2015 | Choi .................. H01L 25/0657 257/774 |
| 2016/0111380 | A1 | 4/2016 | Sundaram et al. |
| 2019/0287853 | A1 | 9/2019 | Maekawa et al. |

FOREIGN PATENT DOCUMENTS

KR 20080029654 A * 4/2008 ........... H01L 21/762

OTHER PUBLICATIONS

International Search Report and Written Opinion for International Application No. PCT/US2020/048097; Application Filing Date Aug. 27, 2020; dated Nov. 6, 2020 (13 pages).

(Continued)

Primary Examiner — Jasmine J Clark
(74) Attorney, Agent, or Firm — Cantor Colburn LLP (57) ABSTRACT A through-wafer via substrate includes a substrate having an intermediate layer and a bonding layer formed on a surface of the intermediate layer. A via cavity extends through the bonding layer and into the intermediate layer, and a stress buffer liner is deposited directly on inner sidewalls and a base of the via cavity. An electrically conductive through-wafer via is disposed in the via cavity such that the stress buffer liner is interposed completely between the intermediate layer and the through-wafer via.

20 Claims, 13 Drawing Sheets (56) References Cited

OTHER PUBLICATIONS

Shorey et al., "Progress and application of through glass via (TGV) technology" 2016 Pan Pacific Microelectronics Symposium (Pan Pacific) IEEE, Jan. 25, 2016 (6 pages).

Takahashi et al., "Development of through glass via (TGV) formation technology using electrical discharging for 2.5/3D integrated packaging." IEEE 63rd Electronic Components and Technology Conference, May 28, 2013 (pp. 348-352).

Wu "Design and Demonstration of Ultra-Miniaturized Glass-Based 3D IPD Diplexers and 3D IPAC RF Front-End Modules for LTE Applications" (Doctoral dissertation, Georgia Institute of Technology). Georgia Institute of Technology, Dec. 2017 (178 pages).

* cited by examiner

OXIDE LINER STRESS BUFFER

BACKGROUND

The present disclosure relates generally to through-wafer via processing, and more particularly, to glass wafers including through-wafer vias.

Aerospace and space-based applications commonly employ airtight seals (referred to as hermetic seals) to protect components from the surrounding environment. Silica fused wafers (i.e., glass wafers) provide excellent hermetic sealing qualities when bonded together and are therefore commonly used in space-based applications. There is typically a need to establish an electrical connection through one or more of the wafers. As a result, electrically conductive through-wafer vias are typically formed through one or more of the wafers to provide an interconnection.

SUMMARY

According to a non-limiting embodiment, a method of forming a substrate including a through-wafer via comprises forming a substrate including a layer of fused silica, and forming a via cavity in the layer of fused silica. The method further comprises depositing a stress buffer liner that conforms to inner sidewalls and a base of the via cavity, and filling the via cavity with an electrically conductive material to form the through-wafer via.

According to another non-limiting embodiment, a through-wafer via substrate includes a substrate having an intermediate layer and a bonding layer formed on a surface of the intermediate layer. A via cavity extends through the bonding layer and into the intermediate layer, and a stress buffer liner is deposited directly on inner sidewalls and a base of the via cavity. An electrically conductive through-wafer via is disposed in the via cavity such that the stress buffer liner is interposed completely between the intermediate layer and the through-wafer via.

According to yet another non-limiting embodiment, a stacked wafer substrate comprises a first intermediate layer and a first bonding layer formed on a surface of the intermediate layer, and a second intermediate layer and a second bonding layer formed on a surface of the intermediate layer and fused directly to the first intermediate layer. An electrically conductive fused through-wafer via extends continuously through both the first intermediate layer and the second intermediate layer. A stress buffer liner extends continuously through both the first intermediate layer and the second intermediate layer. The stress buffer liner completely encapsulates the fused through-wafer via such that the fused through-wafer via is completely separated from the first and second intermediate layers.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts. FIGS. 1-10 are a series of views illustrating a method of forming a substrate including a through-wafer via according to non-limiting embodiments of the present teachings, in which:

FIGS. 11-13 are a series of views illustrating a method of forming a stacked wafer substrate including a fused through-wafer via according to non-limiting embodiments of the present teachings, in which:

DETAILED DESCRIPTION

It is common for two or more glass wafers to be bonded together in order to establish physical connection between two or more through-wafer vias. For example, a top glass wafer having a top through-wafer via can be bonded to a bottom glass wafer having a bottom through-wafer via so that physical contact is established between the top and bottom through-wafer vias. A fusion-bonding technique is typically performed to induce expansion of the vias such that they contact one another and fuse together to form a single continuous via. The fusion bonding process typically includes annealing the glass wafers at a high-temperature ranging, for example, from about 150 degrees Celsius (° C.) to about 450° C.

Traditional through-wafer vias are established by forming a via cavity in the glass wafer and then filling the via cavity with a conductive via material (e.g., metal) such that the metal directly contacts the sidewalls of the via cavity. The glass via cavity sidewalls, however, are significantly rough and jagged compared to via cavity sidewalls formed in other materials. When performing the subsequent fusion bonding process described above, the metal expands and applies a lateral stress upon the sidewalls of the via cavity. The rough and jagged surface of the sidewalls, however, promotes and enhances cracking in the glass wafer. These cracks can cause a multitude of defects and issues in downstream processing in addition to reducing the reliability of the completed product.

Various non-limiting embodiments described herein provides a stacked wafer substrate including one or more through-wafer vias, and a methods of fabricating the same. Unlike conventional fabrication processes, the embodiments described herein greatly reduce or even completely exclude the undesirable cracks typically found in the individual wafers. In one or more non-limiting embodiments, a thin oxide stress buffer is conformally deposited to line the sidewalls of a via cavity prior to depositing the conductive via material. The thin oxide stress buffer smoothens the sidewalls of the via cavity by filling in any ridges and deformities. Accordingly, the glass wafer realizes significant improved resistance against cracking during the fusion bonding process. Therefore, one or more embodiments of describing a method of forming through-wafer vias described herein increase glass wafer yield and address reliability and quality deficiencies traditional found in stacked glass wafer substrate that include through-wafer vias.

Figure 1:
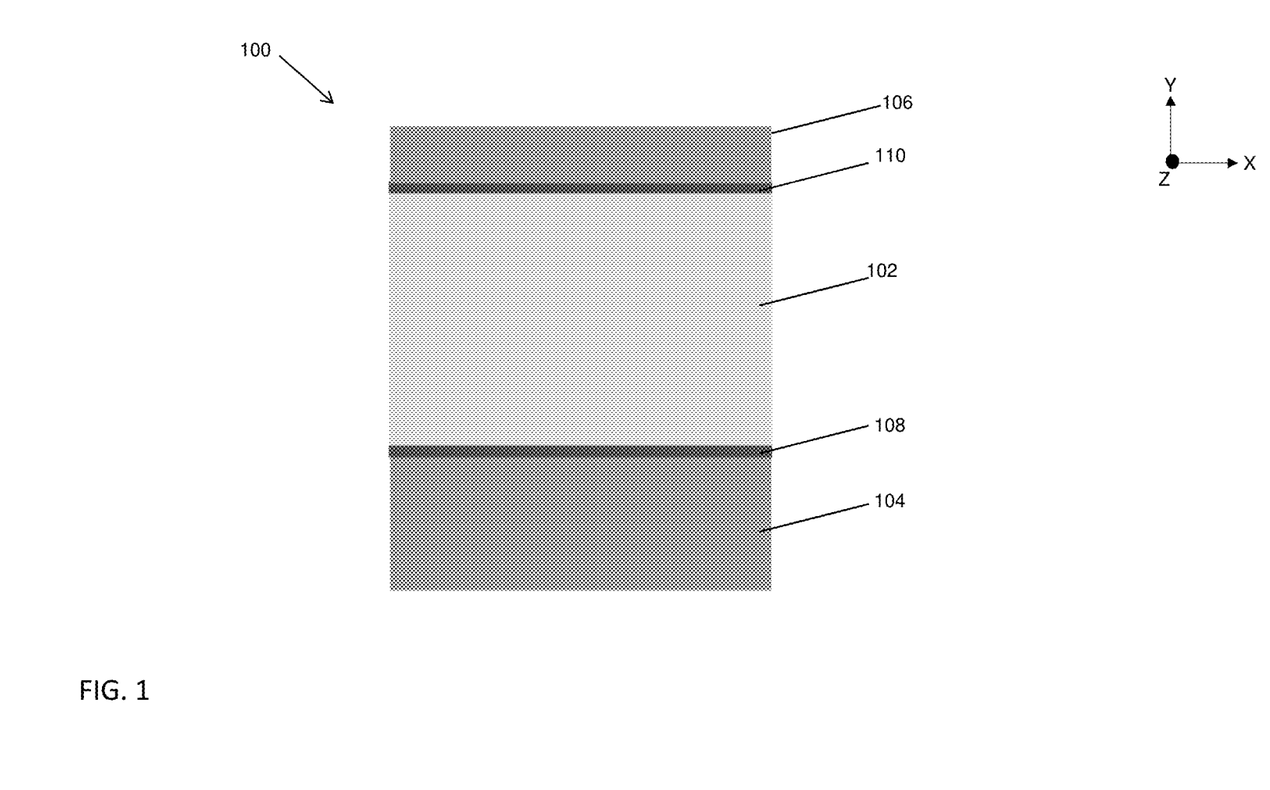
FIG. 1 is a cross-sectional view of an initial starting substrate according to a non-limiting embodiment.

With reference now to FIG. 1, a starting substrate 100 is illustrated according to a non-limiting embodiment. The starting substrate 100 includes an intermediate layer 102 interposed between a handle wafer 104 and a hardmask layer 106. The substrate 100 can extend along a first axis (e.g., X-axis) to define length, a second axis (e.g., Y-axis) to define a height (e.g., vertical thickness) and a third axis (e.g., Z-axis) to define a width.

The intermediate layer 102 can be formed of various materials including, but not limited to, fused silica (i.e., glass), and can have a thickness ranging, for example, from about 40 microns to about 200 microns. Although fused silica is described going forward, other materials may be used including, but not limited to, silicon carbide (SiC), and sapphire ($Al_2O_3$). The handle wafer 104 can be formed from various bulk substrate materials such as, for example, silicon (Si). The hardmask layer 106 can be formed from various rigid materials including, but not limited to, Si and silicon nitride (SiN), and can have a vertical thickness, for example, ranging from about 20 microns to about 40 microns.

Forming the handle wafer 104 and the hardmask layer 106 from Si, for example, allows for performing a known thermal oxidation process to grow an oxide material therefrom. The oxide material can serve as a bonding layer, which facilitates bonding together stacked substrates as described in greater detail below.

In one or more non-limiting embodiments, a first oxide layer 108 is formed on a surface of the handle wafer 104, and a second oxide layer 110 is formed on a surface of the hardmask layer 106. The first and second oxide layers 108 and 110 can include various oxide materials such as silicon dioxide ($SiO_2$), silicon monoxide (SiO), and a mixture of silicon oxide compounds in which the average oxygen content varies from about 0.8 to 2, for example, and can have a vertical thickness (e.g., extending along the X-axis) ranging, for example, from about 300 nanometers (nm) to about 3000 nm and can each facilitate an oxide direct bonding process. In this manner, the first oxide layer 108 can be utilized to directly bond the handle wafer 104 to one end of the intermediate layer 102 and the second oxide layer 110 can be utilized to directly bond the hardmask layer 106 to the opposite end of the intermediate layer 102.

Alternatively, the handle wafer 104 and hardmask layer 106 can be formed from materials other than Si, and separate dielectric layers (not shown) can be formed on the opposing sides of the intermediate layer 102 (e.g., via adhesive). In this manner, a first oxide-to-oxide bond can be established to bond the handle wafer 104 to one side of the intermediate layer 102 and a second oxide-to-oxide bond can be established to bond the hardmask layer 106 to the opposite side of the intermediate layer 102.

Figure 2:
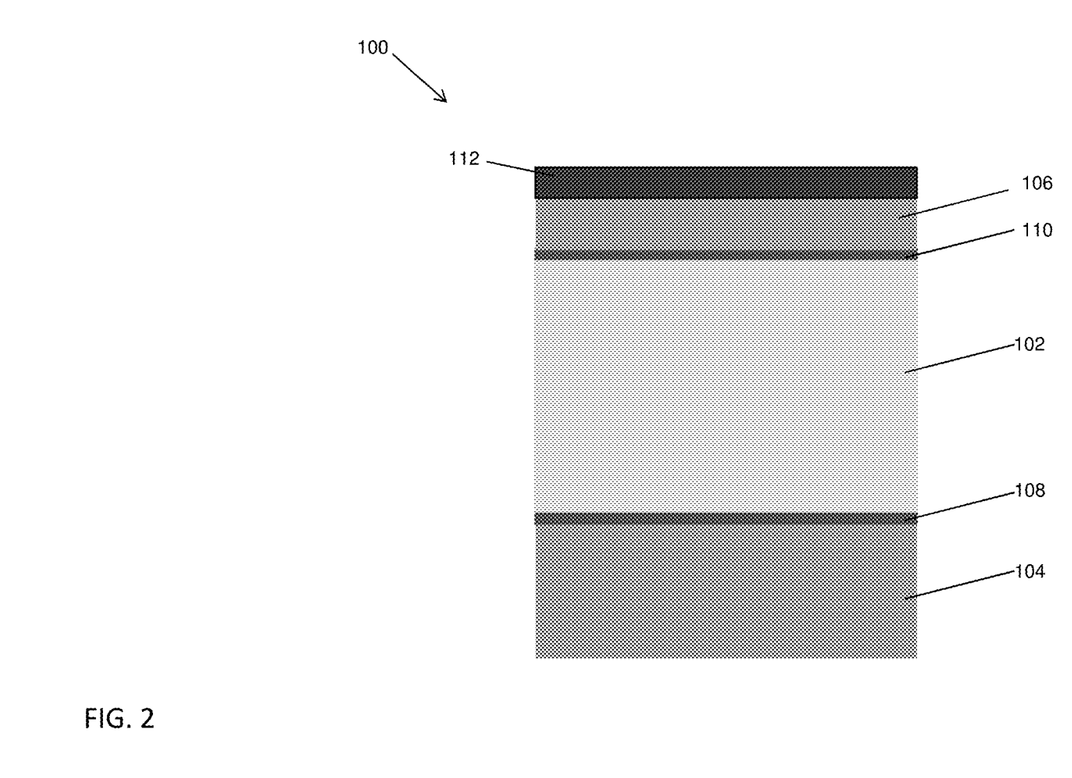
FIG. 2 illustrates the substrate following deposition of a photoresist on the substrate according to a non-limiting embodiment.
Figure 3:
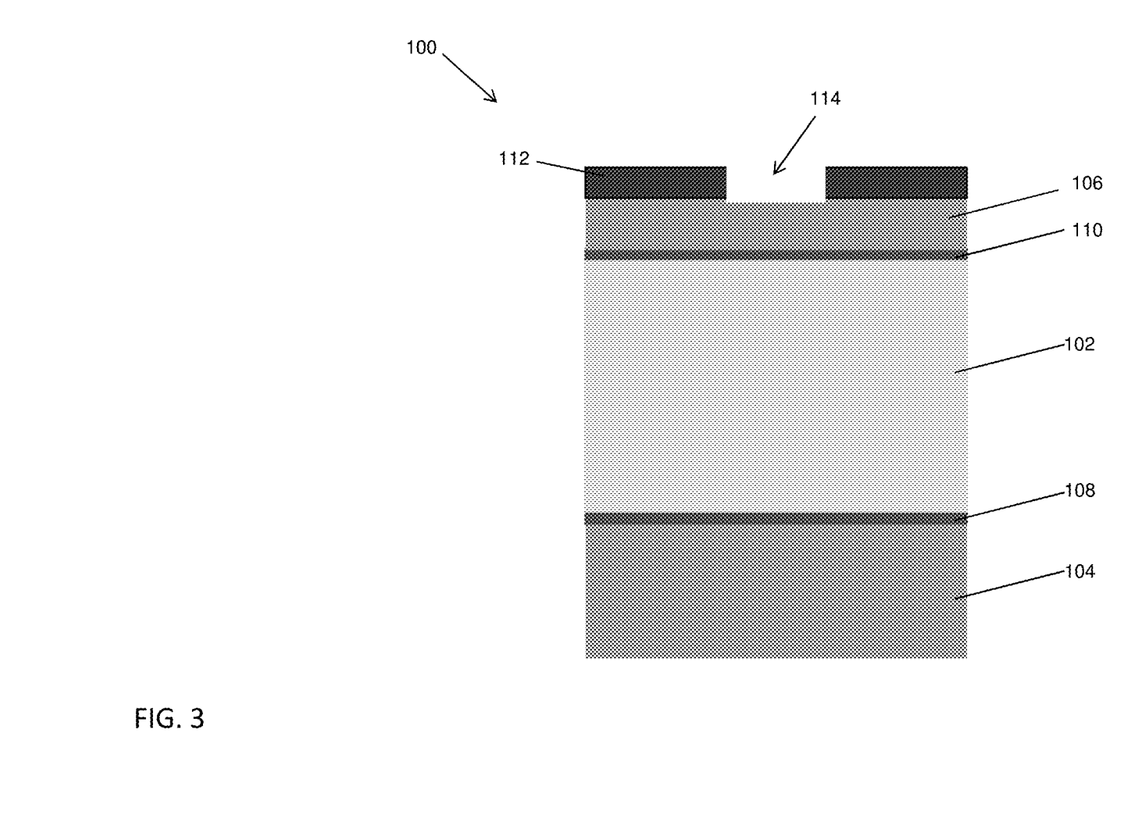
FIG. 3 illustrates the substrate after patterning the photoresist on an upper surface of a hardmask layer according to a non-limiting embodiment.

Turning now to FIG. 2, the substrate 100 is illustrated after forming a photoresist 112 on the upper surface of the hardmask layer 106. The photoresist 112 includes various known light-sensitive materials, and can be deposited using known spin-on deposition techniques. The photoresist 112 can then be patterned using a photoresist mask (not shown) and known patterning techniques to form a pattern 114 therein as shown in FIG. 3. The dimensions and profile and of the pattern will define the dimensions and profile of the ensuing through-wafer via, and therefore can vary depending on the current through-wafer via design. In one or more non-limiting embodiments, the pattern 114 defines an opening having a diameter ranging, for example, from about 20 microns to about 100 microns.

Figure 4:
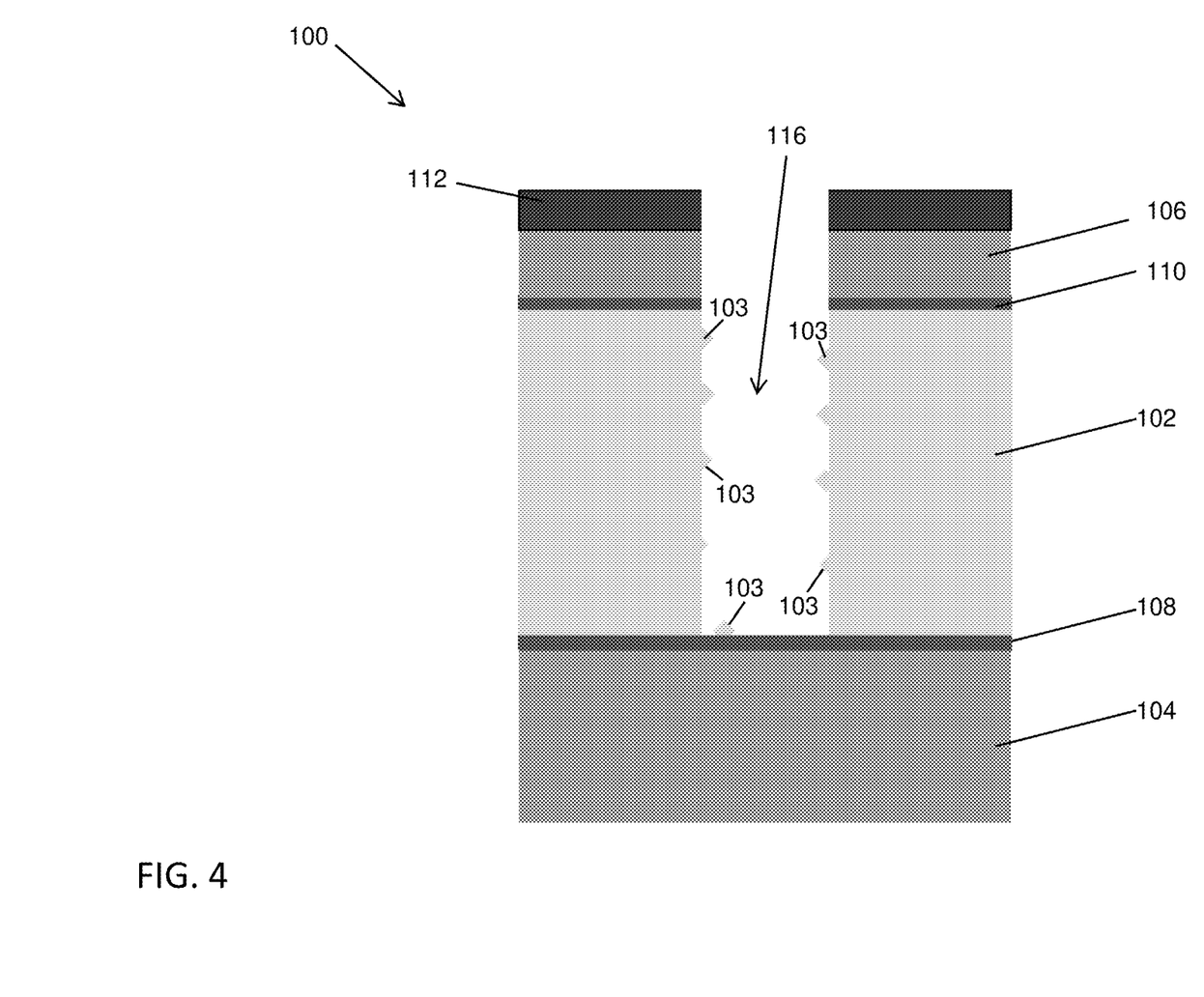
FIG. 4 illustrate the substrate after transferring the photoresist in an intermediate layer to form a via cavity according to a non-limiting embodiment.
Figure 5:
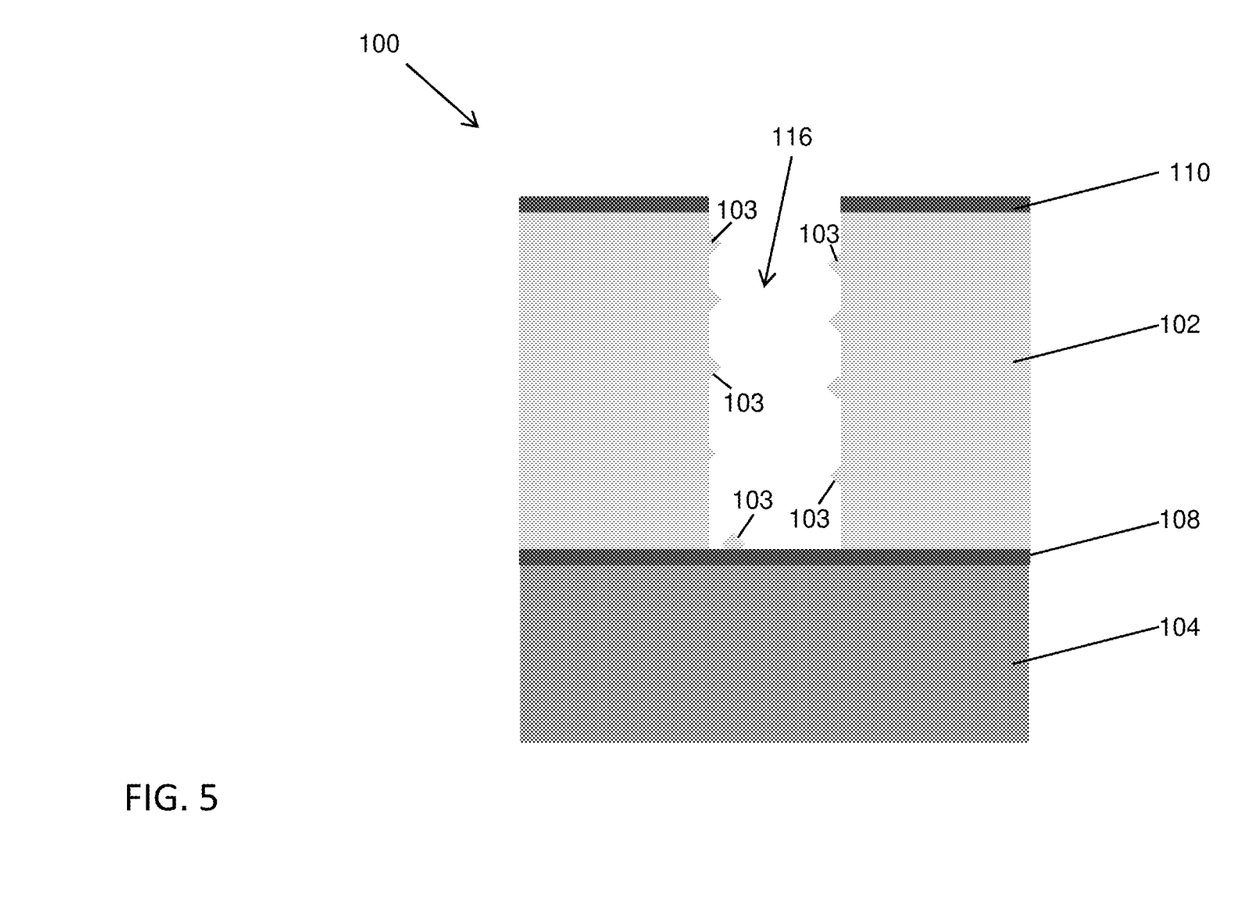
FIG. 5 illustrate the substrate after removing the photoresist and hardmask layer according to a non-limiting embodiment.

Turning to FIG. 4, the substrate 100 is illustrated after transferring the pattern 114 into the intermediate layer 102 to form a via cavity 116. In one or more non-limiting embodiments, the hardmask layer 106 can be patterned selective to the developed photoresist 112 using a reactive ion etch (RIE) process. The RIE process can include a single RIE that extends through hardmask layer 106 and second oxide layer 110 and continues into the intermediate layer 102 until stopping on the first oxide layer 108. In other examples, a first RIE process can be performed which stops on the second oxide layer 110, while a subsequent RIE process punches through the second oxide layer 110 and extends into the intermediate layer 102 until stopping on the first oxide layer 108. Once the via cavity 116 is formed in the intermediate layer 102, a chemical-mechanical planarization (CMP) process can be performed that removes the remaining portions of the photoresist 112 and hardmask 106. Accordingly, the upper surface of second oxide layer 110 is exposed as shown in FIG. 5.

Figure 6:
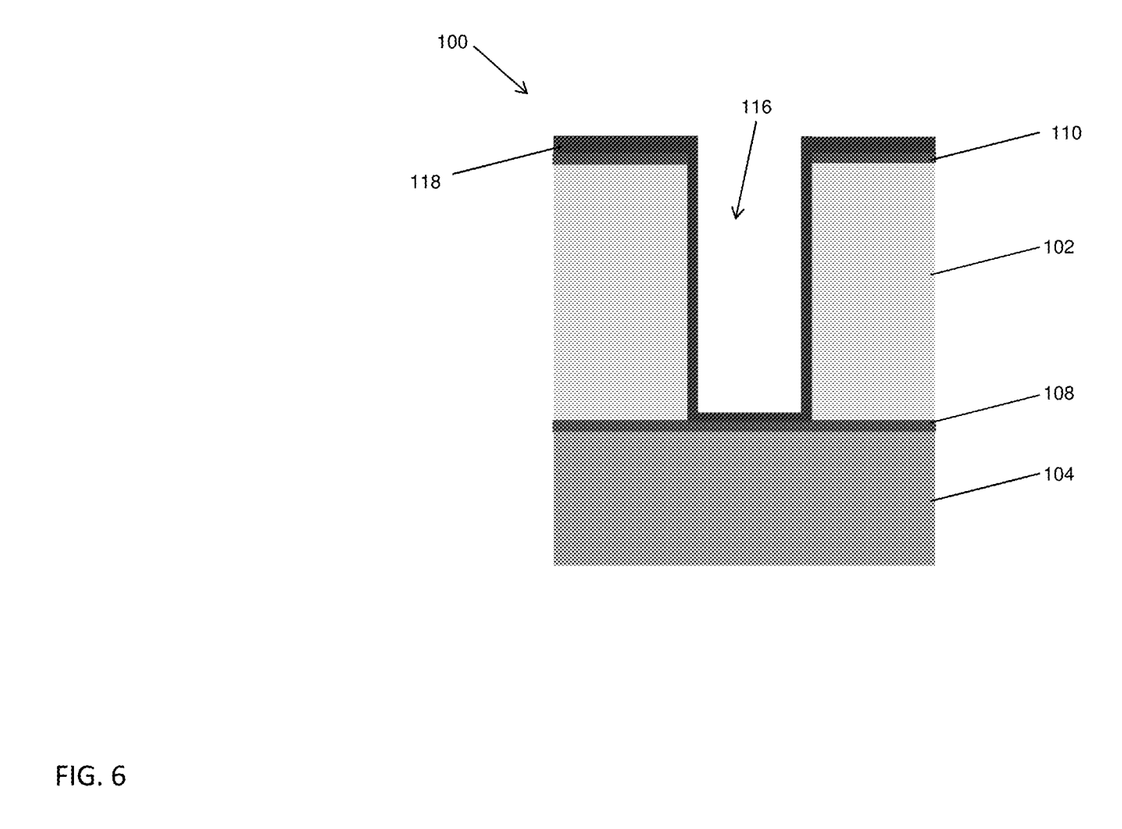
FIG. 6 illustrates the substrate following a conformal deposition process that forms a stress buffer liner that lines the sidewalls of the via cavity according to a non-limiting embodiment.

Referring now to FIG. 6, the substrate 100 is illustrated following a conformal deposition process that deposits a stress buffer liner 118. The stress buffer liner 118 lines the sidewalls and base of the via cavity 116. The stress buffer liner 118 can be formed from an oxide material such as SiO2, for example, and can have a thickness ranging, for example, from about 100 nm to about 700 nm. The conformal deposition process used to deposit the stress buffer liner 118 can include, but is not limited to, physical vapor deposition (PVD), chemical vapor deposition (CVD), etc. The stress buffer liner 118 smoothens the sidewalls of the via cavity 116 by filling in any ridges, divots and deformities 103 (see FIGS. 4 and 5). Accordingly, an intermediate layer 102 formed of fused silica (i.e., glass) realizes significant improved resistance against cracking when the ensuing through-hole via experiences thermal expansion in response to being annealed at high temperatures.

Figure 7:
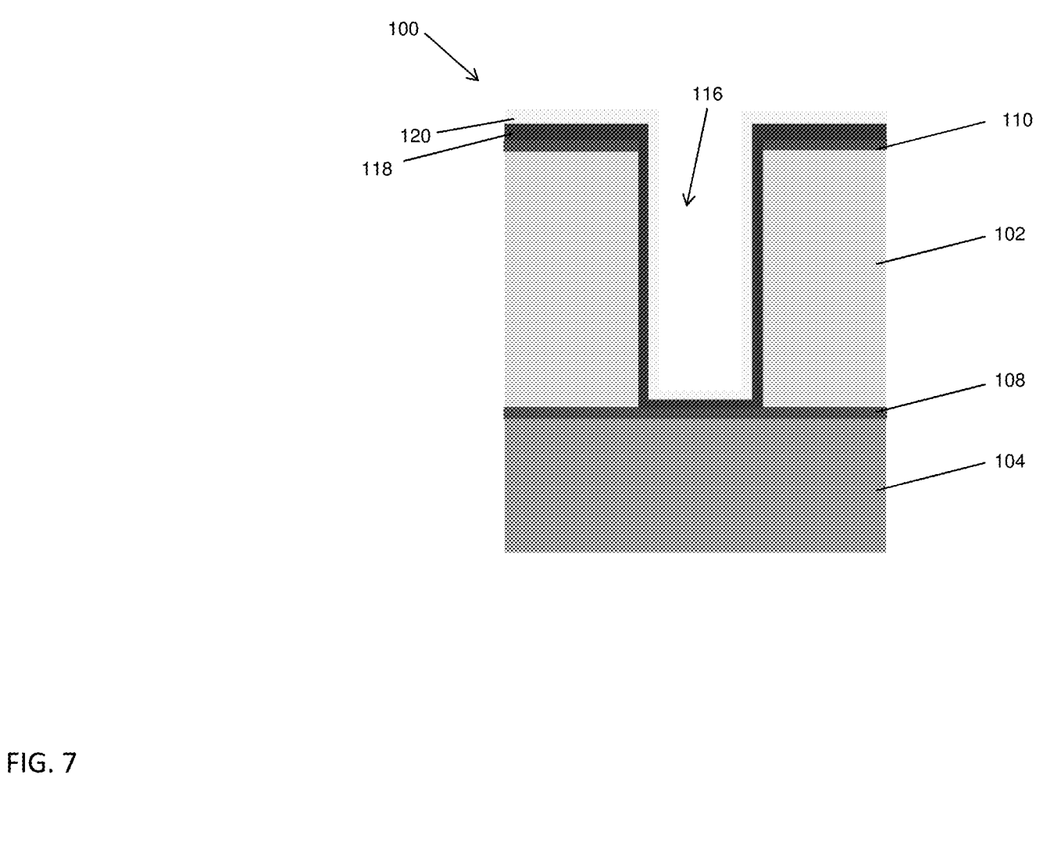
FIG. 7 illustrates the substrate following a deposition process that forms a workfunction barrier layer that conforms to outer surface of the stress buffer liner according to a non-limiting embodiment.

Referring to FIG. 7, the substrate 100 is illustrated following a deposition process that forms a diffusion barrier layer 120 on the stress buffer liner 118. The diffusion barrier layer 120 can have a thickness ranging, for example, from about 10 nm to about 400 nm and can be deposited using a CVD process or atomic layer deposition (ALD) process so that conformally deposits the diffusion barrier layer 120 directly against the outer surface of the stress buffer liner 118. The diffusion barrier layer 120 can include various materials including, but not limited to, tantalum nitride (TaN), titanium nitride (TiN), and titanium tungsten (TiW), and combination thereof, which serve to inhibit or completely prevent diffusion of the electrically conductive material used to form the ensuing through-wafer via into the intermediate layer 102.

Figure 8:
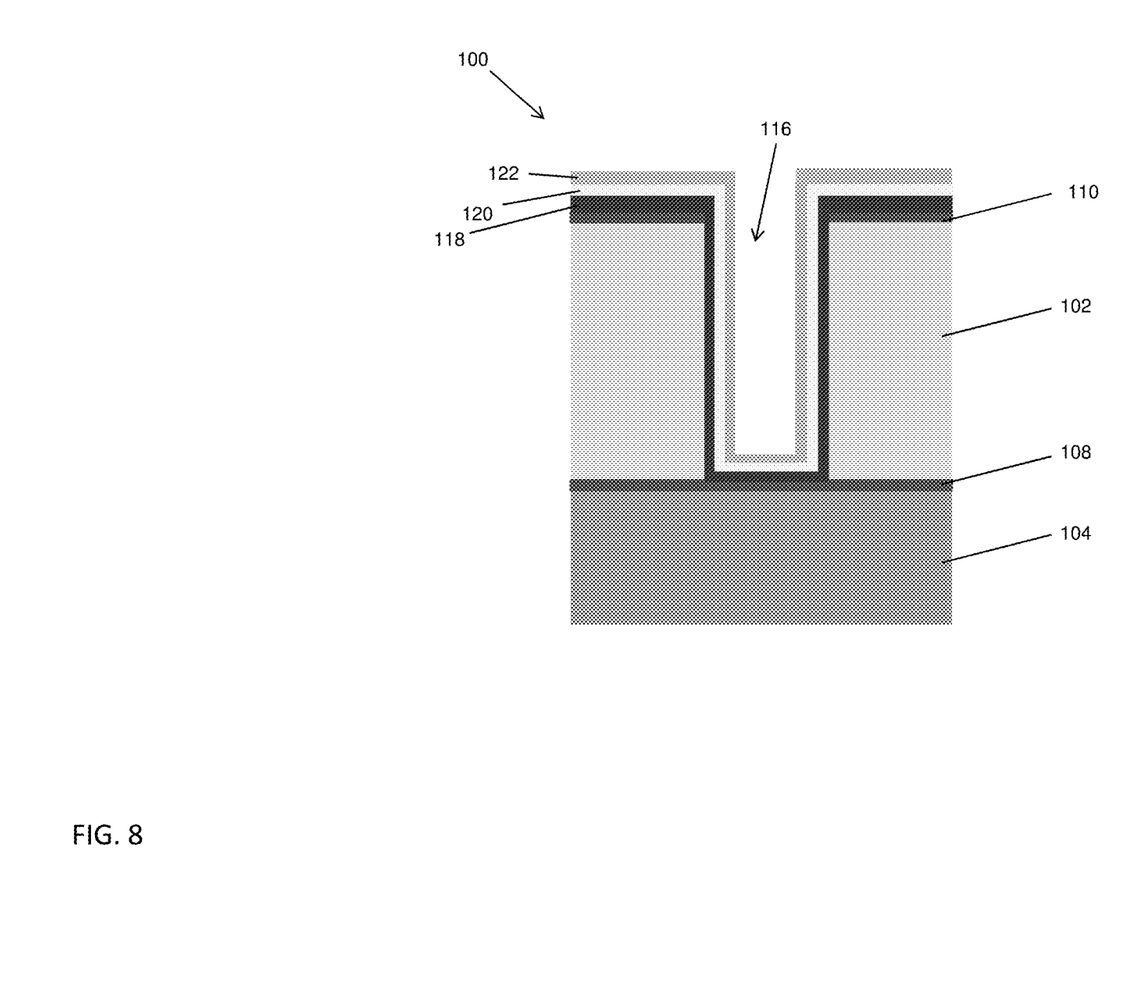
FIG. 8 illustrates the substrate following a deposition process that forms an electrically conductive seed layer that conforms to outer surface of the workfunction barrier layer according to a non-limiting embodiment.

FIG. 8 illustrates the substrate 100 following a deposition process that conformally deposits an electrically conductive seed layer 122 on the exposed surface of the diffusion barrier layer 120 and serves to promote electroplating growth of the ensuing through-wafer via. The seed layer 122 can include various metal materials selected to match the material of the through-wafer via. In one or more non-limiting embodiments, the conductive seed layer 122 includes copper (Cu), and has a thickness ranging, for example, from about 200 nm to about 400 nm.

Figure 9:
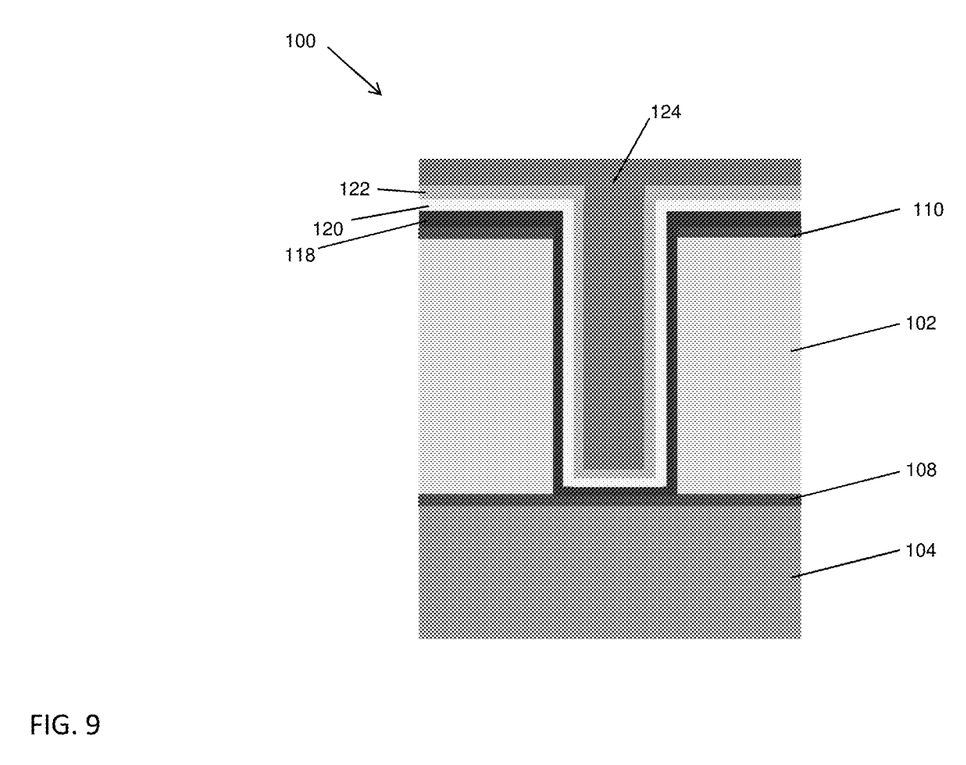
FIG. 9 illustrates the substrate after filling the via cavity with an electrically conductive material according to a non-limiting embodiment.

FIG. 9 illustrates the substrate 100 after filling the via cavity 116 with an electrically conductive material 124. As mentioned above, an electroplating process can be performed, which grows a metal material from the seed layer 122. In one or more embodiments, the electroplating process grows copper (Cu) on a copper seed layer 122 until the copper completely fills the via cavity 116.

Figure 10:
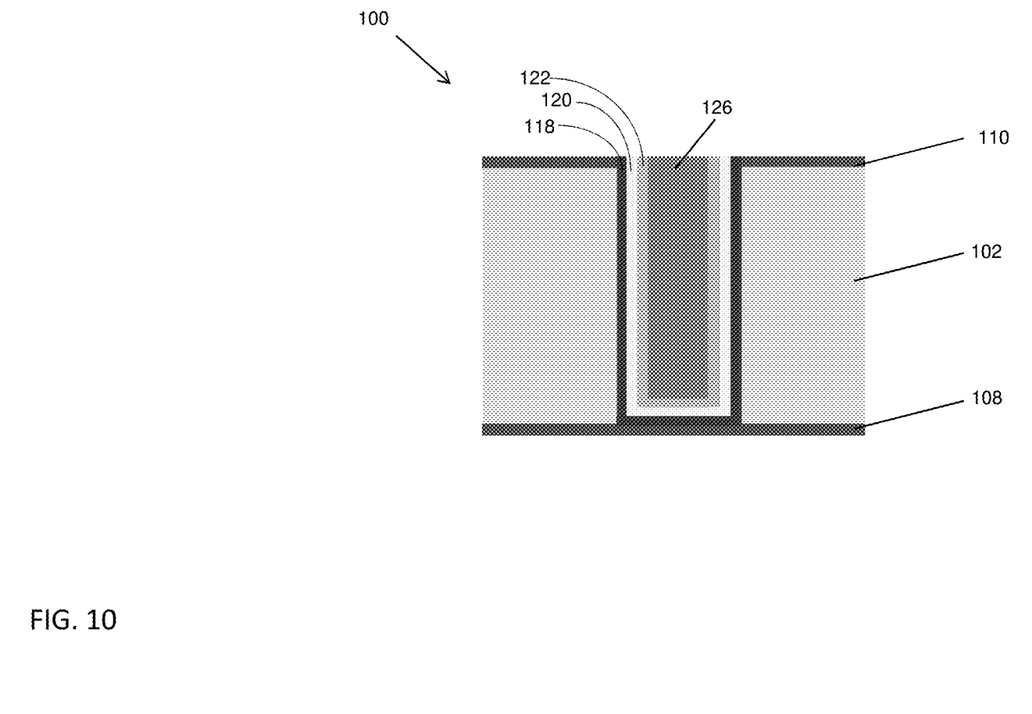
FIG. 10 illustrates the substrate after performing a chemical mechanical planarization (CMP) process that that stops on an upper surface of a bonding interface layer to form the through-wafer via in the substrate according to a non-limiting embodiment.

Once the via cavity 116 is filled, a CMP process is performed to remove the copper overfill and remaining portions of the seed layer 122, barrier layer 120 and stress buffer liner 118. The CMP process can stop on the upper surface of bonding layer 110, thereby forming a through-wafer via 126 in the substrate 100 as shown in FIG. 10. The CMP process ensures that the upper surface of the through-wafer via 126 is co-planar (i.e. flush) or substantially co-planar with the upper surface of the bonding layer 110. This co-planar surface provides a uniform bonding surface when a design application aims to bond the substrate 100 to another mating substrate. The handle wafer 104 can be subsequently removed from the first bonding layer 108 as further illustrated in FIG. 10.

Figure 11:
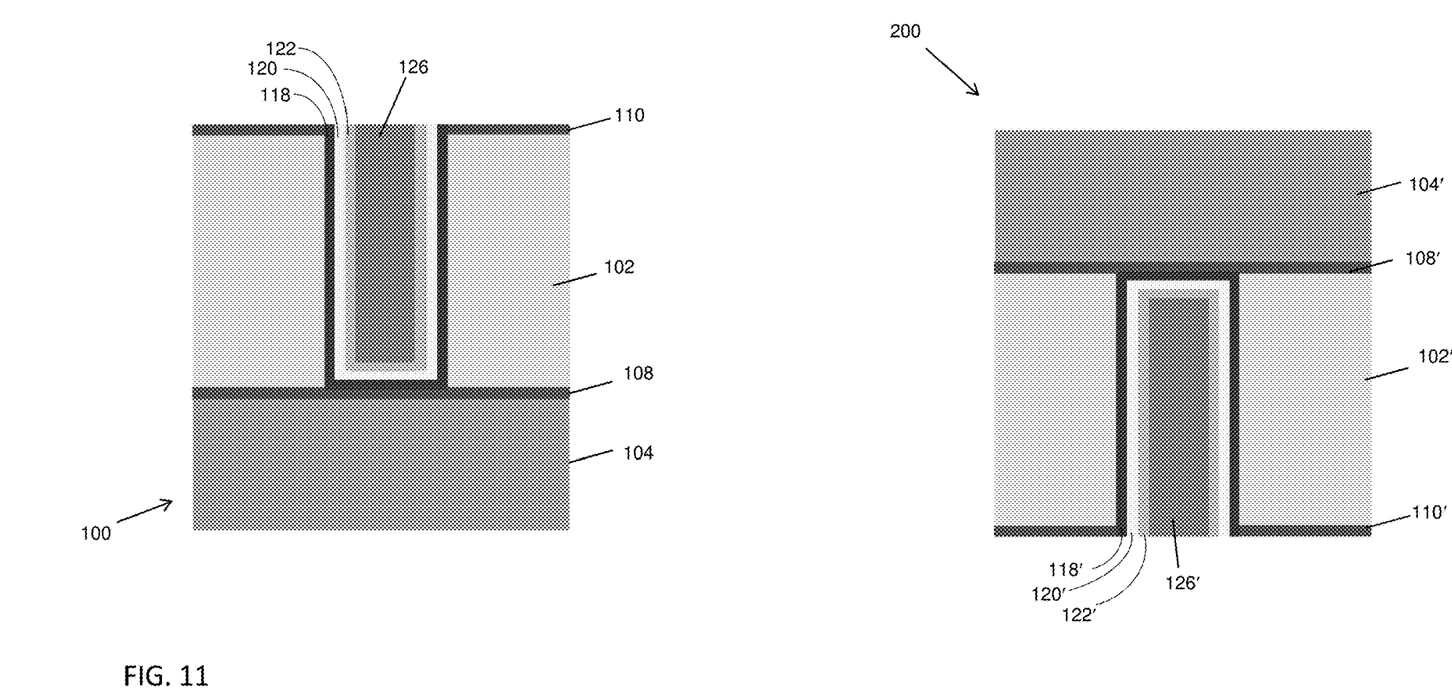
FIG. 11 illustrate a first substrate including a first through-wafer via and a second substrate including a second through-wafer via according to a non-limiting embodiment.
Figure 12:
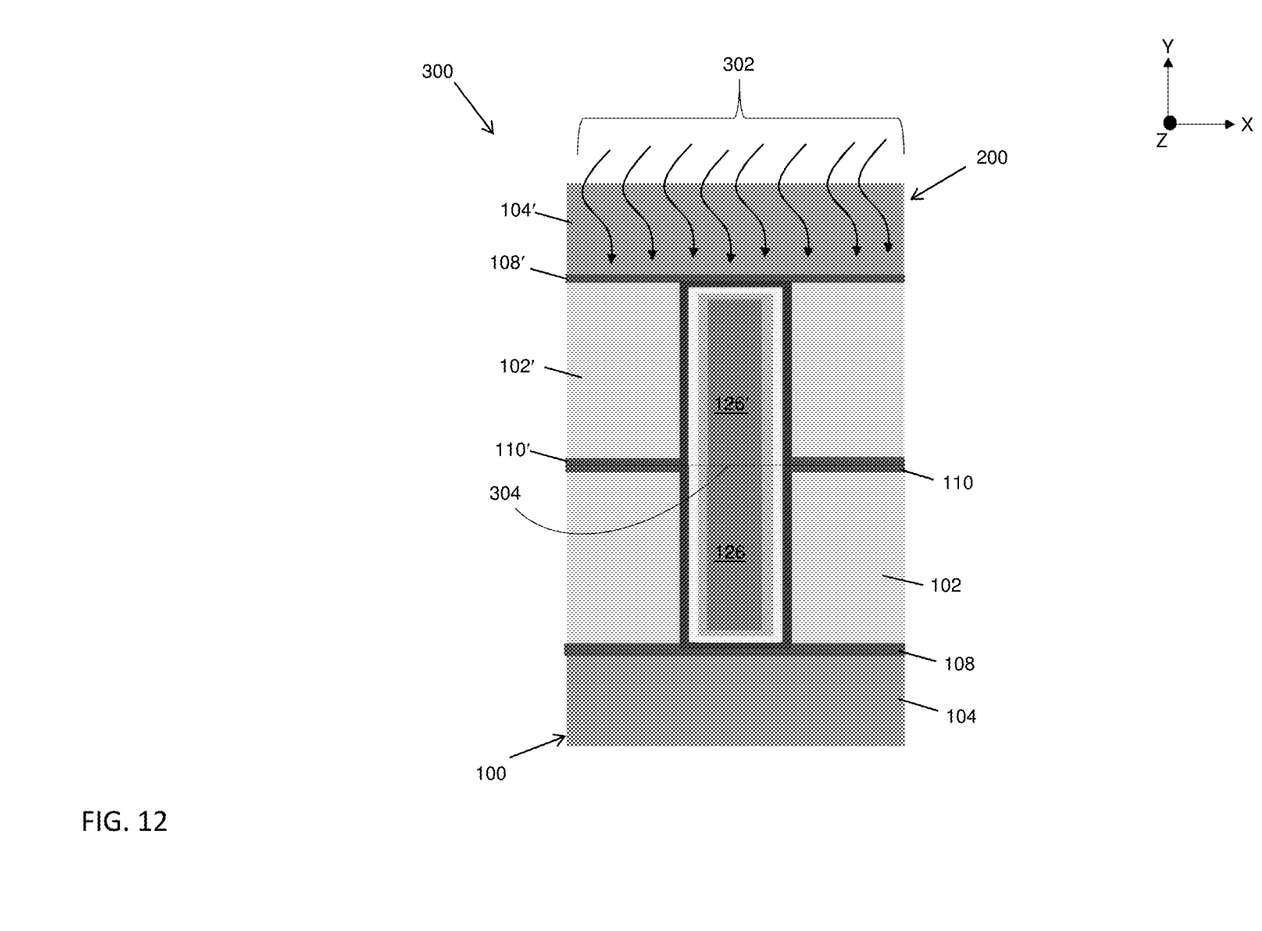
FIG. 12 illustrates the second substrate stacked on the first substrate while undergoing a high-temperature anneal process according to a non-limiting embodiment.
Figure 13:
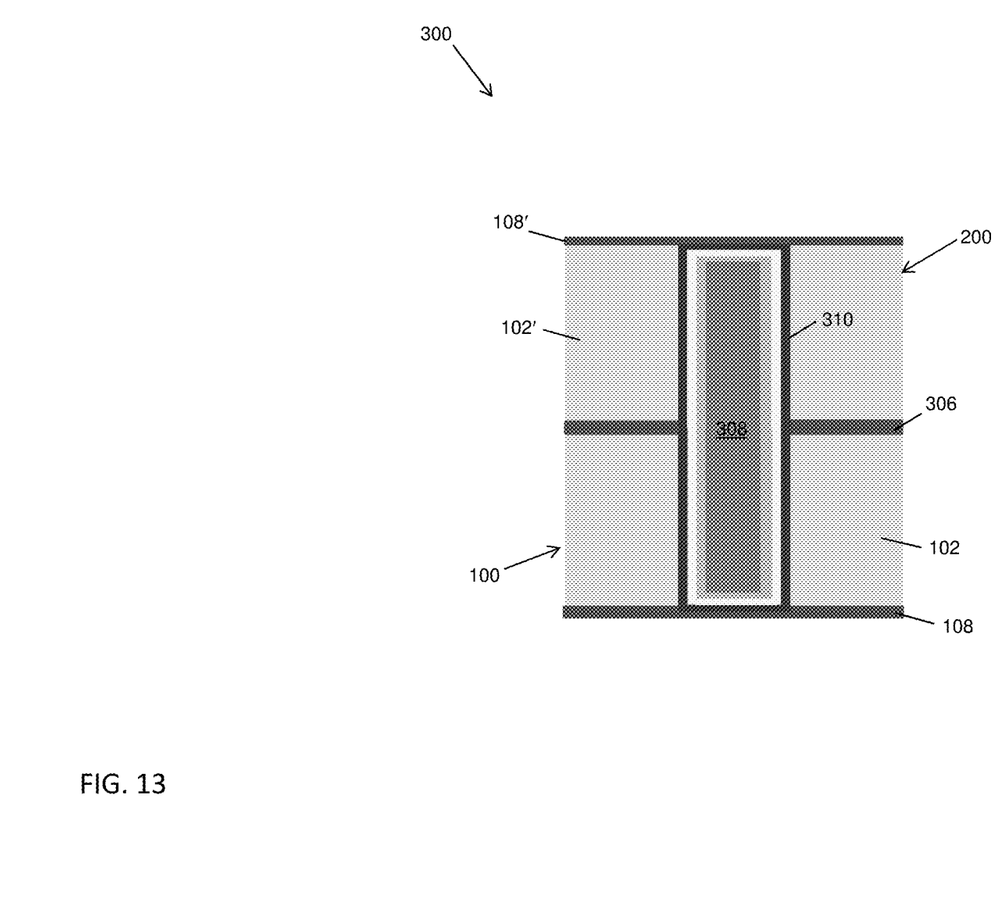
FIG. 13 illustrates a stacked wafer substrate including a fused through-wafer following the high-temperature anneal process according to a non-limiting embodiment.

Turning now to FIGS. 11, 12 and 13, a series of views illustrates a process flow for forming a stacked wafer substrate including a single fused through-wafer via according to non-limiting embodiments of the present teachings. Referring first to FIG. 11, a first substrate 100 and a second substrate 200 (i.e. a mating substrate) are shown. The second substrate 200 is shown as being rotated 180 degrees with respect to the first substrate 100 in preparation to be stacked thereon. The first substrate 100 includes a first through-wafer via 126 and the second substrate 200 includes a second through-wafer via 126' (i.e., a mating through-wafer via) according to a non-limiting embodiment. The second substrate 200 can be constructed to include elements similar to those included in the first substrate 100. Similar components and elements are indicated by reference numerals denoted by a prime ('). A detailed description of similar components are described in detail above and will not be repeated for the sake of brevity.

FIG. 12 illustrates the second substrate 200 stacked on the first substrate 100 to form a stacked wafer substrate 300. More specifically, the oxide layer 110' (i.e., mating oxide layer) of the second substrate 200 is arranged on the upper surface of the oxide layer 110 of the first substrate 100 so that the mating side of the second substrate 200 and the exposed upper surface (i.e., mating surface) of the second through-wafer via 126' faces the exposed upper surface of the first through-wafer via 126.

The second substrate 200 is also arranged so that the first through-wafer via 126 is vertically aligned (e.g., along the Y-axis) with the second through-wafer via 126'. Accordingly, a fusion bonding interface 304 is formed between the first through-wafer via 126 and the second through-wafer via 126'. In one or more embodiments, the fusion bonding interface 304 is horizontally aligned (e.g., along the X-axis) with respect to the bonding interface defined by the contact between the first and second bonding layers 110/110'.

Once stacked, a fusion bonding process is performed. The fusion bonding process includes applying a high-temperature anneal 302 to the stacked wafer substrate 300. The high-temperature anneal 302 can include applying temperature ranging from about 100° C. to about 450° C. The high-temperature applied by the anneal 302 induces thermal expansion of the first and second through-wafer vias 126/126'. Accordingly, the exposed upper surfaces of the first and second through-wafer vias 126/126' expand vertically (i.e., along the Y-axis) and are forced into contact with one another where the high-temperatures fuse them together. Unlike traditional through-wafer via designs, the stress buffer liner 118 and mating stress buffer liner 118' mitigate the lateral stress (i.e., along the X-axis), thereby reducing or even preventing cracking in the intermediate layers 102/102'.

Turning to FIG. 13, the stacked wafer substrate 300 is illustrated following the high-temperature anneal process and removal of the handle wafers 104/104'. Accordingly, the first substrate 100 and the second substrate 200 are fused at the oxide layers 110/110' and are bonded together to form a fused oxide interface 306. Moreover, the first and second through-wafers 126/126' are fused together to form a single fused through-wafer via 308 that extends continuously through the stacked wafer substrate 300, including through the fused oxide interface 306.

As discussed above, the oxide stress buffer liners 118/118' smooth the sidewalls of the via cavities containing the through-wafer vias 126/126'. In addition, the oxide stress buffer liners 118/118' are effectively fused together to form a continuous oxide stress buffer liner 310 that completely encapsulates the diffusion barrier layers 120/120', the seed layers 122/122', and the fused through-wafer via 308. In this manner, the fused through-wafer via 308 is completely separated from the intermediate layers 102/102' (e.g., the fused silica layers) by the continuous oxide stress buffer liner 310. Accordingly, the intermediate layers 102/102' of the stacked wafer substrate 300 realize significant improved resistance against cracking during the anneal and fusion bonding process. Therefore, an increased yield of stacked fused silica wafer substrates can be achieved, while also improving the reliability and quality of each tacked fused silica wafer substrates 300.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a substrate including a through-wafer via, the method comprising:
    forming a substrate including a layer of fused silica to produce a wafer;
    forming a via cavity in the layer of fused silica;
    depositing a stress buffer liner that conforms to inner sidewalls and a base of the via cavity; and
    filling the via cavity with an electrically conductive material to form a through-wafer via.

2. The method according to claim 1, wherein the stress buffer liner completely separates the electrically conductive material from the layer of fused silica.

3. The method according to claim 2, wherein filling the via cavity comprises:
    depositing a barrier layer on the outer surface of the stress buffer liner;
    depositing a seed layer on the outer surface of the barrier layer; and
    growing the electrically conductive material from the seed layer.

4. The method according to claim 3, wherein each of the stress buffer liner, the barrier layer and the seed layer are interposed between the layer of fused silica and the though-wafer via.

5. The method according to claim 1, wherein the stress buffer liner reduces deformities in the fused silica thereby smoothing the surface of the via cavity sidewalls and base.

6. The method of claim 1, wherein forming the substrate comprises:
    forming a first bonding layer on a first side of the fused silica layer;
    forming a second bonding layer on a second side of the fused silica layer opposite the first side; and
    forming the via cavity such that it extends between the first bonding layer and the second bonding layer.

7. The method of claim 1, further comprising:
    forming a second substrate including a second stress buffer liner having a first surface that directly contacts a second fused silica layer and an opposing second surface that directly contacts a second through-wafer via such that the second stress buffer liner is interposed completely between the second fused silica layer and the second through-wafer via; and
    bonding together the substrate and the second substrate such that the through-wafer via of the first substrate physically contacts the second through-wafer via of the second substrate.

8. The method of claim 7, further comprising:
    forming an oxide layer on a first side of the fused silica layer, wherein a first surface of the through-wafer via extends through the oxide layer and is exposed;
    forming a second oxide layer on a second side of the second fused silica layer, wherein a second surface of the second through-wafer via extends through the second oxide layer and is exposed; and
    performing a fusion bonding process so as to fuse together the oxide layer and the second oxide layer to form a stacked wafer substrate.

9. The method of claim 6, wherein the fusion bonding process further includes annealing the substrate and the second substrate so as to form a single fused through-wafer via that extends continuously through both the substrate and the second substrate.

10. A through-wafer via substrate comprising:
    a wafer including an intermediate layer and a bonding layer formed on a surface of the intermediate layer;
    a via cavity extending through the bonding layer and into the intermediate layer;
    a stress buffer liner directly on inner sidewalls and a base of the via cavity; and
    an electrically conductive through-wafer via disposed in the via cavity such that the stress buffer liner is interposed completely between the intermediate layer and the electrically conductive through-wafer via.

11. The through-wafer via substrate of claim 10, further comprising:
    a diffusion barrier layer on the stress buffer liner and conforming to the sidewalls and the base of the via cavity; and
    a seed layer on the diffusion barrier layer and conforming to the sidewalls and the base of the via cavity,
    wherein the stress buffer liner is interposed between the intermediate layer and the diffusion barrier layer.

12. The through-wafer via substrate of claim 11, wherein the intermediate layer comprises fused silica.

13. The through-wafer via substrate of claim 12, wherein the bonding layer and the stress buffer liner each comprise an oxide material.

14. The through-wafer via substrate of claim 13, wherein the seed layer and the electrically conductive through-wafer via each comprise a metal material.

15. A stacked wafer substrate comprising:
    a first intermediate layer and a first bonding layer formed on a surface of the intermediate layer;
    a second intermediate layer and a second bonding layer formed on a surface of the intermediate layer and fused directly to the first intermediate layer;
    an electrically conductive fused through-wafer via extending continuously through both the first intermediate layer and the second intermediate layer; and
    a stress buffer liner extending continuously through both the first intermediate layer and the second intermediate layer and completely encapsulating the electrically conductive fused through-wafer via such that the electrically conductive fused through-wafer via is completely separated from the first and second intermediate layers.

16. The through-wafer via substrate of claim 15, further comprising:
    a diffusion barrier layer on the stress buffer liner and conforming to an inner surface of the stress buffer liner; and
    a seed layer on the diffusion barrier layer and conforming completely to an inner surface of the diffusion barrier layer,
    wherein the stress buffer liner is interposed between the first and second intermediate layers and the diffusion barrier layer.

17. The through-wafer via substrate of claim 16, wherein the first and second intermediate layers each comprise fused silica.

18. The through-wafer via substrate of claim 17, wherein the first bonding layer, the second bonding layer, and the stress buffer liner each comprise an oxide material.

19. The through-wafer via substrate of claim 18, wherein the seed layer and the electrically conductive fused through-wafer via each comprise a metal material.

20. The through-wafer via substrate of claim 16, wherein first and second bonding layers are fused together at a bonding interface, and wherein the electrically conductive fused through-wafer via extends through the bonding interface.

* * * * *